331/98

SEARCH ROOM

United States Patent

[11] 3,600,703

[72] Inventor Robert G. Geissler Cranford, N.J.

[21] Appl. No. 838,455
[22] Filed July 2, 1969
[45] Patented Aug. 17, 1971
[73] Assignee Solitran Devices, Inc.

[54] SCHOTTKY BARRIER DIODE NOISE GENERATOR
10 Claims, 6 Drawing Figs.

[52] U.S. Cl. .......... 331/78, 317/235 UA
[51] Int. Cl. .......... H03b 29/00
[50] Field of Search .......... 331/78; 307/317, 318; 317/235, 235 UA

[56] References Cited

UNITED STATES PATENTS 2,624,836 1/1953 Dicke .......... 331/78 X
3,476,984 11/1969 Tibol .......... 317/234

FOREIGN PATENTS 905,019 9/1962 Great Britain .......... 331/78

OTHER REFERENCES

Krakauer et al., Electronics, July 19, 1963, pp. 53— 55 (317–235/31)

*Primary Examiner*—Roy Lake
*Assistant Examiner*—Siegfried H. Grimm
*Attorney*—Bernard Malina

ABSTRACT: An electrical noise generator employs a Schottky barrier diode operative in the breakdown region as the active noise generating device in a noise generator circuit. The Schottky barrier diode employed is selected to have low internal resistance and uniformity of breakdown across the junction area.

INVENTOR
ROBERT G. GEISSLER

BY

Bernard Malina
ATTORNEY

INVENTOR.
ROBERT G. GEISSLER

BY

Bernard Malina
ATTORNEY

SCHOTTKY BARRIER DIODE NOISE GENERATOR

The present invention relates to electronic random noise generation and more particularly to a solid state broad frequency spectrum noise generator.

Random voltages are generally used as test signals for electronics equipment and in particular to determine the frequency response, stability and power handling capability of amplifiers. Other common uses for random noise voltages are as a basic reference for calibrating both low and high frequency radio receivers, radar systems, and specific radio receiver equipment for analysis of cosmic noise random stimulation of computers to determine stability; as random sound signals for use in composition of electronic music; for providing source random numbers for statistical use; as signals for use in electronic counter measures; and as signals for use in destructive testing of electronic components.

Noise generator circuits presently in use typically employ temperature-limited diodes, thyratrons and gas discharge tubes as their active noise generating elements. These noise-generating devices require relatively high voltages, such as 100 volts to 2000 volts to ionize the gas therein to make the gas tube conduct the 1 ma.-200 ma. current necessary for generation of a random noise output. In addition to the fact that these presently used gas tubes are inherently bulky, cumbersome, and operate at high temperatures, they require large and heavy power supplies. Furthermore, each of such gas tubes is limited in frequency response, so that a number of tubes are required to generate random noise over a spectrum of such as 0 to 12.6 Kilo MC, each of which require different associated components.

A further disadvantage of such conventional gas tube noise generators is their lack of sufficient stability over wide ranges of ambient operating temperatures. The aforementioned disabilities of weight and temperature sensitivity are particularly acute in airborne equipment such as in aircraft, missiles and spacecraft which are employed at high altitudes and/or high operating temperatures.

The Schottky barrier diode is a semiconductor device which is operable to be switched from its forward conduction region to its reverse conduction region in a very short period of time e.g. about 1 picosecond. This property has made the Schottky diode very useful at microwave frequencies in various applications such as a high speed switch, phase detector as well as other applications which require a device with very fast switching characteristics.

The present invention is directed to the utilization of the Schottky barrier diode in a function heretofore not associated with such a diode, namely to generate electrical noise when operated in its reverse conduction region.

It is therefore an object of the present invention to provide a random noise generator operative over a very wide frequency range.

It is another object of the present invention to provide a random noise generator of the character described which is compact, rigid and requires very low power consumption.

It is a further object of the present invention to provide a random noise generator of the character described employing a Schottky barrier-diode as its noise generating element.

In accordance with the present invention there is provided a Schottky barrier diode and means for reverse biasing this diode into the breakdown mode whereby this diode produces a noise signal output across its terminals.

The features of the invention which are believed novel are set forth with particularity in the appended claims. The invention itself, however, both as to its organization and method of operation, together with further objects and features thereof may be understood with reference to the following description taken in conjunction with the accompanying drawings wherein.

Figure 1:
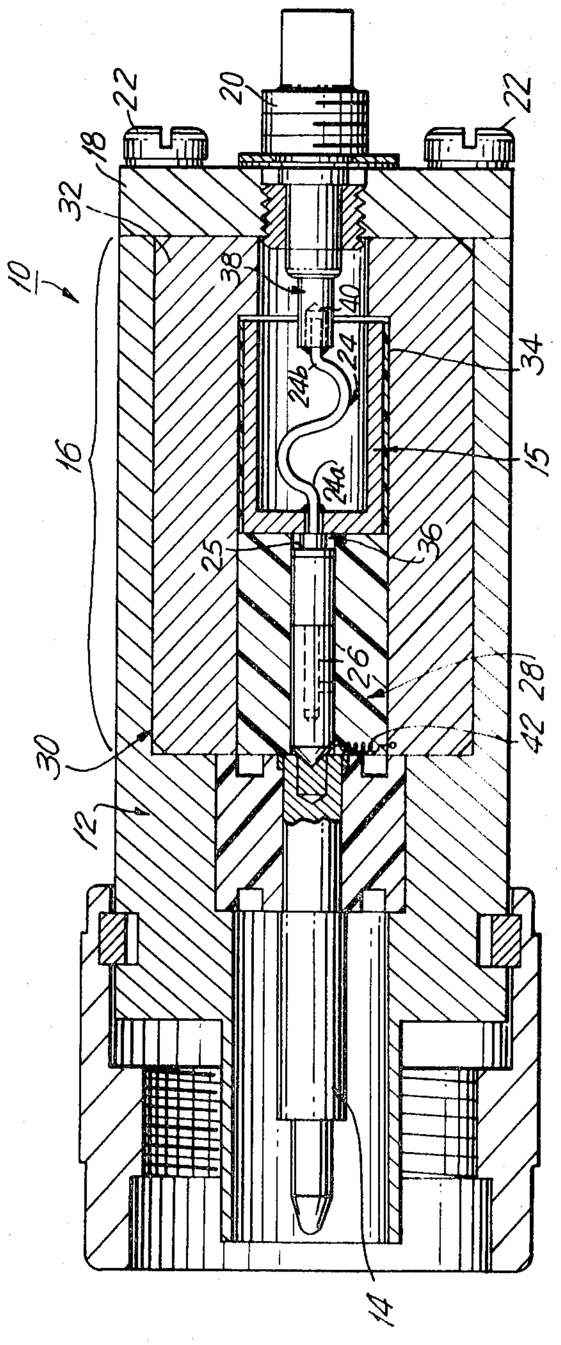
FIG. 1 is a sectional view through a noise generator constructed in accordance with the principles of the present invention in a preferred embodiment thereof.

Referring to the drawings and in particular to FIG. 1, the noise source assembly 10 comprises a bored-out cylinder 12 provided with a type-N male connector 14 mounted at the front end of cylinder 12 for providing an output terminal for the generated noise output from assembly 10. A preassembled noise module 16, to be described in greater detail hereafter, is inserted from the rear end of cylinder 12 with noise module 16 being held in place in cylinder 12 by means of circular back plate 18. Furthermore, a DC connector 20 is inserted through the central opening in back plate 18 which is retained in screw threaded engagement by means of screws 22.

Preassembled noise module 16 comprises a bored-out cylinder 32 including a center conductor 26 held in place by Teflon bushing 28 which in turn is fixedly retained by N connector 14 and capacitor 30 which comprises a hollow cylinder 15 of Aluminum material which is insulated from the surrounding concentric metal cylinder 32 by a strip 34 of mylar of approximately 0.002 inches thick. Thus, mylar strip 34 comprises the dielectric, and hollow cylinders 15 and 32 comprise the metal plates of capacitor 30.

The other end of center conductor 26 makes contact with noise diode 36, hereafter described in greater detail, which comprises a pill-shaped ceramic and metal package.

Noise diode 36 is held in place by spring-loaded contact 24 which is affixed at one end **24*a* to the metallized ceramic case 25 at the cathode end of diode 36, and at the other end 24*b* thereof to center conductor 38 of DC connector 20, thereby placing current limiting resistor 40 in electrical series contact with diode 36**.

A suitable DC bias voltage may be suitably applied through center conductor 38 of DC connector 20 and current limiting resistor 40. A DC return path is provided through inductor 42, which comprises a relatively small coil of wire soldered between center conductor 26 and brass cylinder 32.

Figure 2:
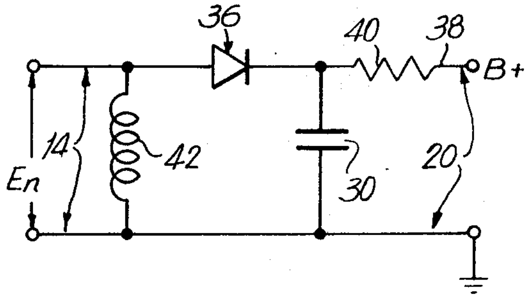
FIG. 2 is an electrical schematic diagram of the noise generator of FIG. 1.

Reference is made to FIG. 2 showing an electrical schematic circuit depicting the electrical components discussed hereinabove with respect to FIG. 1 and their electrical interconnection. Accordingly, the elements shown in electrical schematic form in FIG. 2 are accorded the same identifying numerals as the mechanical, i.e. structural, depiction thereof in FIG. 1.

Thus, in FIG. 2 current limiting resistor 40 has one end thereof connected to the DC bias voltage (B+) through center conductor 38 of connector 20, with the other end thereof connected to the cathode of noise diode 36, capacitor 30 is connected between the cathode of diode 36 and ground, while inductor 42 is connected between the anode of diode 36 and the ground, and the noise voltage output, E*n*, is produced at type-N male connector 14.

It is understood that although a preferred mechanical arrangement of the electrical components of FIG. 2 has been shown in FIG. 1, many other structural arrangements are possible in order to achieve the electrical schematic arrangement of FIG. 2 in order to effectively reverse-bias Schottky barrier diode 36 to generate a noise output and to utilize such noise voltage in a noise generator.

Noise Diode 36

As previously noted, noise diode 36 comprises a nickel-silicon Schottky barrier diode mounted in a ceramic-metal package. Diode 36 is operated in its reverse mode in the breakdown region at a current level of approximately 15 ma.

to yield a uniform current density. It has been found that such operation of diode 36 causes it to generate random electrical impulses at frequencies ranging from DC to greater than 18.0 GHz.

The mechanical structure surrounding diode 36, bushing 28, cylinder 32 and cylinder 12, is operative to separate the DC voltage applied through DC connector 20 from the high frequency noise output which is available at connector 14. This separation of the DC and high frequency noise components is due to the fact that inductor 12 is an open circuit to ground with respect to the RF noise frequencies generated by diode 36 while concurrently acting as a DC short circuit to ground. Accordingly, only the RF noise output is made available at connector 14.

Furthermore, capacitor 30 is operative to short circuit to ground the RF noise signals produced by diode 36 to prevent transmission of the noise output while allowing the DC current component to flow from connector 20 to diode 36.

Selection of Diode 36

Figures 3, 4:
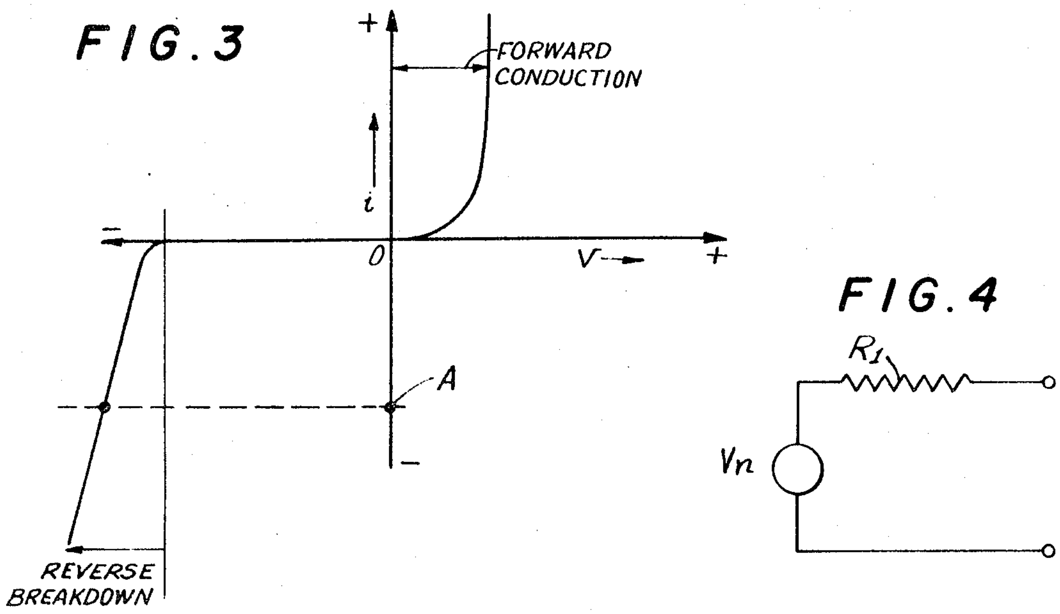
FIG. 3 is a graphical depiction of the current voltage characteristic of the Schottky barrier diode shown in FIGS. 1 and 2.
FIG. 4 is an electrical schematic diagram of the equivalent circuit of the Schottky barrier diode shown in FIGS. 1 and 2.

The following discussion is directed to those criteria believed to be relevant in the selection of suitable Schottky barrier diodes 36 to provide optimum noise output thereof. Reference is made to FIG. 3 showing the current-voltage relationship for a Schottky barrier diode in its various modes of operation, and to FIG. 4 which is the equivalent circuit for a diode operative as a noise source.

Generally speaking, ordinary semiconductor diodes, generate noise when operated in the breakdown region. This noise, however, is generally considered to be undesirable for electrical use due to its nonuniformity, unpredictable occurrence, and basic instability due to the lack of precise structural controls available in such other types of diodes. Low internal resistance and uniformity of breakdown across the junction area are believed to be the criteria for generating useable or desirable noise. Thus, a diode biased at point A in FIG. 3 is electrically equivalent to the circuit of FIG. 4, showing a noise source of voltage $V_n$ having an internal resistance $R_i$.

Figure 5:
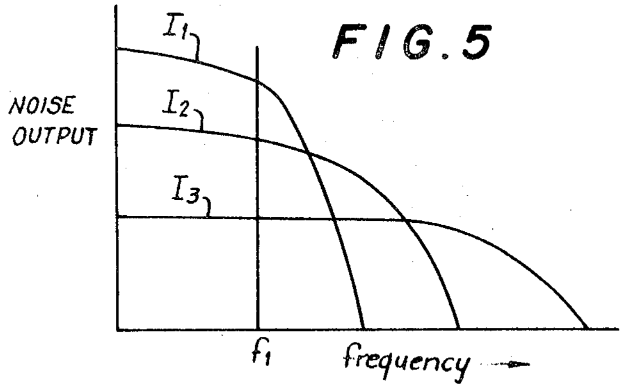
FIG. 5 is a graphical depiction of the noise voltage output vs. frequency for various current levels in a Schottky barrier diode.

The current level at point A is chosen such that the noise output vs. frequency curve is flat from very low frequencies to the maximum frequency of operation. The specific optimum current level is determined by measuring the noise output vs. frequency at various current levels i.e. $I_1$, $I_2$ and $I_3$, and plotting this series of curves, as shown in FIG. 5; where curves $I_1$, $I_2$ and $I_3$ represent current levels increasing in magnitude. Thus, if the maximum frequency of operation contemplated is $f_1$, a current level $I_1$ would be employed as a bias current in order to obtain optimum, i.e. maximum flatness of the noise output vs. frequency curve previously noted; while retaining a sufficiently high output level.

Now, the amount of noise power delivered to a matched load is given by the expression $V_n^2/4R_i$ where $V_n$ and $R_i$ are the noise source voltage and internal resistance thereof as shown in FIG. 4.

Figure 6:
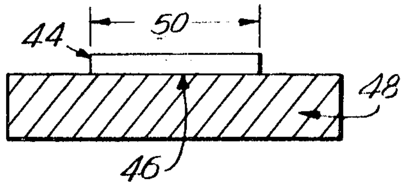
FIG. 6 is a cross-sectional view through the pill-shaped Schottky barrier diode of FIGS. 1 and 2.

Referring to FIG. 6, the junction region 46, or the interface between metal 44 and silicon 48 is formed by vacuum deposition of a metal layer 44 on the smooth surface of silicon slice 48 across an area 50, sufficiently small to create a minimum of capacitance. While, at the same time, sufficiently large to provide adequate power dissipation. Since the silicon and metal molecules are in intimate contact over the entire area described, current flow, in either forward conduction or reverse breakdown mode inherently occurs in a most uniform manner, fulfilling one of the criteria for generating useable noise.

In practice, various Schottky barrier diodes were measured for noise output vs. internal resistance, a measurement procedure which is readily apparent to those skilled in the art. As a result of these measurements, it was found that there was a direct correlation between the noise output level of the diode and the internal conductance (i.e. $1/R_i$) thereof. This correlation facilitated easy selection from candidate diodes for maximum useable noise content, i.e. the diodes selected were those with highest internal conductance values, that is, with lowest internal resistance, $R_i$. Accordingly, it was found that diodes having an internal resistance, $R_i$, of about 200 ohms gave substantially greater noise output than similar diodes having an internal resistance of about 600 ohms. Thus, the diodes with $R_i$=200 ohms provided a noise output of 30 db. above $K_{t_0}$ where $t_0$=290° Kelvin, whereas these diodes with $R_i$=600 ohms yielded a noise output of about 24 db. above $K_{t_0}$.

While there has been shown a particular embodiment of the present invention it will be understood that it is not wished to be limited thereto, since modifications can be made in the electrical and structural arrangement of the noise generator of the present invention and it is contemplated in the appended claims to cover any such modifications as fall within the scope of this invention.

I claim:

1. An electrical noise generator comprising a Schottky barrier diode and means for biasing said Schottky barrier diode into the breakdown mode whereby a usable noise signal is produced.

2. An electrical noise generator as defined in claim 1 wherein said Schottky barrier diode comprises a chip of semiconductor material, a layer of metal deposited over at least a portion of one surface of said chip thereby creating a Schottky barrier junction between said metal layer and said chip of semiconductive material, said Schottky barrier junction extending over a junction area sufficiently large to dissipate the DC power produced when said Schottky barrier diode is biased into the breakdown region.

3. An electrical noise generator as defined in claim 2 wherein said chip of semiconductive material comprises epitaxial silicon.

4. An electrical noise generator as defined in claim 1 wherein said Schottky barrier diode is housed in a case, said case comprising a metal base for mounting of said chip thereon to provide an efficient thermal transfer path for the heat generated in the diode.

5. An electrical noise generator as defined in claim 1 wherein said biasing means comprises a DC return path connected at one end to one of said diode electrodes and adaptable at the other end thereof to be connected to one terminal of a DC voltage source.

6. An electrical noise generator as defined in claim 5 wherein said DC return path comprises an inductor having one end thereof connected to said one electrode of said diode and the other end thereof adaptable to be connected to said one terminal of said DC voltage source.

7. An electrical noise generator as defined in claim 5 wherein said one electrode comprises the anode of said Schottky diode.

8. An electrical noise generator as defined in claim 6 including means for connecting the cathode of said Schottky diode to the positive terminal of a DC voltage source.

9. A noise generator as defined in claim 5 wherein said biasing means includes a capacitor connected between the other of said diode electrodes and said one terminal of said DC voltage source.

10. A noise generator as defined in claim 9 including a current limiting resistor connected at one end to the other of said diode electrodes and adaptable for connection at its other end to the other terminal of said DC voltage source.